(12) United States Patent
Lo et al.

(10) Patent No.: US 9,512,876 B2
(45) Date of Patent: Dec. 6, 2016

(54) LATCH GUIDE ASSEMBLY

(71) Applicant: GUDENG PRECISION INDUSTRIAL CO., LTD., New Taipei (TW)

(72) Inventors: Hsiao-Chia Lo, New Taipei (TW); Chih-Ming Lin, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 123 days.

(21) Appl. No.: 14/583,751

(22) Filed: Dec. 28, 2014

(65) Prior Publication Data

US 2016/0146246 A1 May 26, 2016

(30) Foreign Application Priority Data

Nov. 25, 2014 (TW) .............................. 103140772 A

(51) Int. Cl.
*E05C 19/10* (2006.01)
*F16C 29/00* (2006.01)
*H01L 21/673* (2006.01)

(52) U.S. Cl.
CPC ....... *F16C 29/005* (2013.01); *H01L 21/67373* (2013.01)

(58) Field of Classification Search
CPC .. Y10T 292/0961; E05C 9/046; Y10S 414/14; E05B 83/30

USPC ............................................................ 292/23
See application file for complete search history.

(56) References Cited

U.S. PATENT DOCUMENTS

| 6,902,063 B2 * | 6/2005 | Pai ................... H01L 21/67373 206/710 |
| 7,077,270 B2 * | 7/2006 | Matsutori ......... H01L 21/67376 206/1.5 |
| 2010/0038281 A1 * | 2/2010 | Lin .................. H01L 21/67373 206/710 |

FOREIGN PATENT DOCUMENTS

TW  M472694 U  2/2014

* cited by examiner

*Primary Examiner* — Mark Williams
(74) *Attorney, Agent, or Firm* — Cheng-Ju Chiang

(57) ABSTRACT

The present invention relates to a latch guide assembly configured on the bottom of a wafer carrier. The latch guide assembly comprises a guide module having at least one guiding groove, a latch module having at least one side plate and at least one recess on the at least one side plate, and at least one rolling unit configured between the at least one guiding groove and the at least one recess. The latch module combines with the guide module via the at least one rolling unit and moves along with the guide module. The latch guide assembly provides a precise moving mechanism to lock/unlock the wafer carrier and reduces both the failure rate and dust production.

8 Claims, 6 Drawing Sheets

LATCH GUIDE ASSEMBLY

BACKGROUND OF THE INVENTION

1. Technical Field

The present invention relates to a latch guide assembly. More particularly, the present invention relates to a latch guide assembly comprising a rolling unit and a track which are configured to guide the movement of a latch. The latch guide assembly provides a precise mechanism to lock/unlock a wafer carrier with ease, and is able to reduce the failure rate and lessen the dust pollution.

2. Description of the Related Art

FIG. 1 illustrates the bottom of a prior art wafer carrier in Taiwanese patent number M472694. The bottom of the prior art wafer carrier comprises a main plate (not shown) and a sealing plate 90, in which the main plate and the sealing plate 90 together form the bottom. A pivot module 6' is further connected to the main plate and comprises at least two auxiliary units 60' and at least two curved tracks 61', and an elastic positioning member 7' comprising two arcuate notches 71' is connected with the at least two auxiliary units 60' to constrain the moving area of the at least two auxiliary units 60'. At least two latches 2' linked with the main plate via T-shaped connector 100 are further connected to the at least two curved tracks 61 respectively, thus rotation of the pivot member 6' would drive the at least two latches 2' to move along the at least two curved tracks 61' and subsequently bring the at least two latches 2' upward and inward with the support of the T-shaped connectors 100. Simultaneously, rotation of the pivot member 6' also drives the at least two auxiliary units 60' to move along the at least two curved tracks 61', which would temporarily stretch the elastic positioning member 7' outward. The arcuate notches 71' of the elastic positioning member 7' are used to position the at least two auxiliary units 60' after the arcuate notches 71' move. The at least two latches 2' are moved obliquely by the T-shaped connectors 100.

The lock module located on the prior art bottom utilizes the curved track configured on the pivot member and the elastic positioning member to drive the latch to move obliquely, and therefore forms a lock/unlock mechanism for a wafer carrier.

The lock/unlock mechanism in the prior art wafer carrier is performed with repeated oblique movements of the latch. However, with the development of the semiconductor industry, the diameter of wafers has been expanded from 6 inches, 8 inches, 12 inches, to 18 inches or larger recently. Simultaneously, the weight that the wafer carrier can bear is also largely increased. Lock modules configured on the bottom of wafer carriers are forced to bear the weight of wafers and sustain repeated twists. The lock modules therefore tend to abrade and generate dust to contaminate the wafers, and the components in a lock module are more inclined to be deformed and aged rapidly.

Accordingly, at least one embodiment of the present invention aims to offer an improved and simplified latch structure compatible with the standard specification for wafer carriers. The latch structure shall be able to reduce the abrasion between the lock module and the latch, implement a precise moving mechanism for the latch, and provide a smooth operation for the lock module.

SUMMARY

At least one embodiment of the present invention relates to a latch guide assembly. The latch guide assembly comprises a guide module having at least one guiding groove, a latch module having at least one side plate, at least one recess disposed on the at least one side plate, and at least one rolling unit disposed between the at least one guiding groove and the at least one recess. The latch module combines with the guide module via the at least one rolling unit and is able to move along with the guide module. In some embodiments, a wafer carrier comprising a latch guide assembly is provided. Such latch guide assembly comprises a guide module, a latch module having side plates, and a rolling unit. With the latch guide assembly, the lock module disposed on the bottom of the wafer carrier may operate smoothly and therefore reduces abrasion of the latch guide assembly.

In some embodiments, the guide module in a latch guide assembly is a stationary member disposed on the bottom of a wafer carrier and the latch module is a mobile member. The guide module and the latch module together are used to lock/unlock the wafer carrier. More particularly, the latch guide assembly comprises the guide module having guiding grooves, the latch module having side plates, recesses configured on the side plates, and rolling units disposed between the guiding grooves and the recesses. As a pivot member in a lock module of the wafer carrier turns, the lock module drives the latch module to slide, guided by the rolling units in the guiding grooves, along the guiding grooves of the guide module steadily. In this moving process, the latch module may contact only with the rolling units. The rolling unit may be a ball, a roller, a bearing or other components in a spherical or cylindrical shape which contacts with the side plate at a point or line. The small contact area between the rolling unit and the side plate may decrease the friction during the moving process of the latch module. Similar to the wheels in a wagon, the rolling unit is able to reduce the time and effort to move the latch module smoothly and therefore suppresses the resistance arose as turning the lock module. Thus some embodiments of the present invention provide a latch guide assembly which extends the life time of the latch module, reduces the mechanical abrasion of the lock module, and lessen the dust pollution during wafer production.

DESCRIPTION OF THE PREFERRED EMBODIMENTS

In a general aspect, at least one embodiment in accordance with the present invention relates to a latch guide assembly. The embodiments and drawings provided here show different aspects of the present invention. However, the present invention is limited to neither any embodiment nor any drawing thereof.

Figure 1:
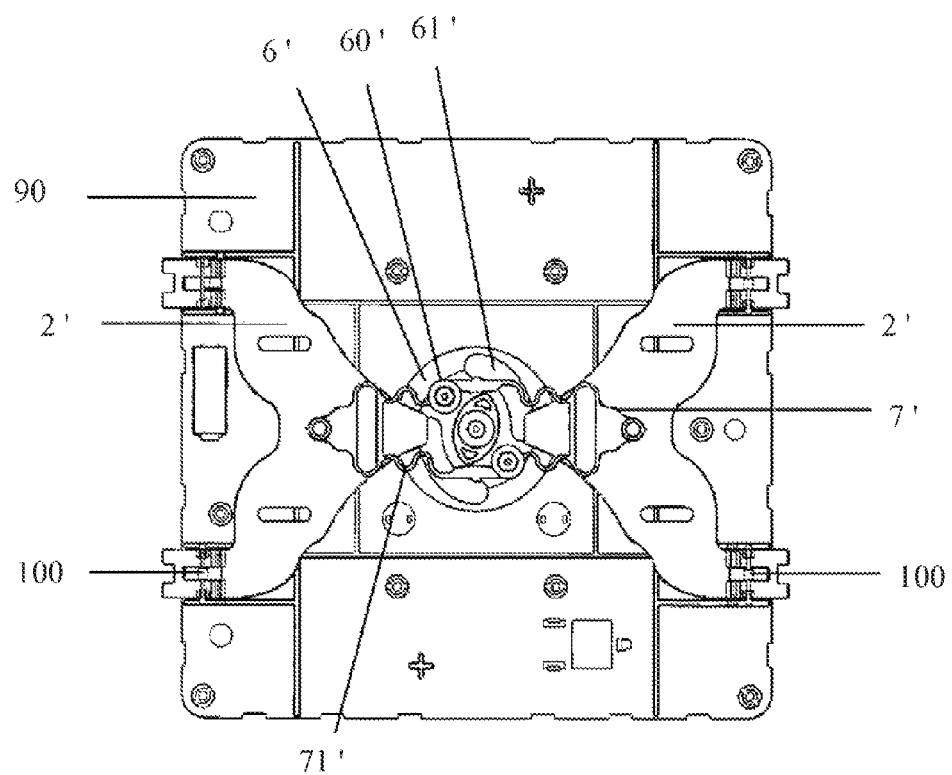
FIG. 1 illustrates the bottom of a prior art wafer carrier.
Figure 2:
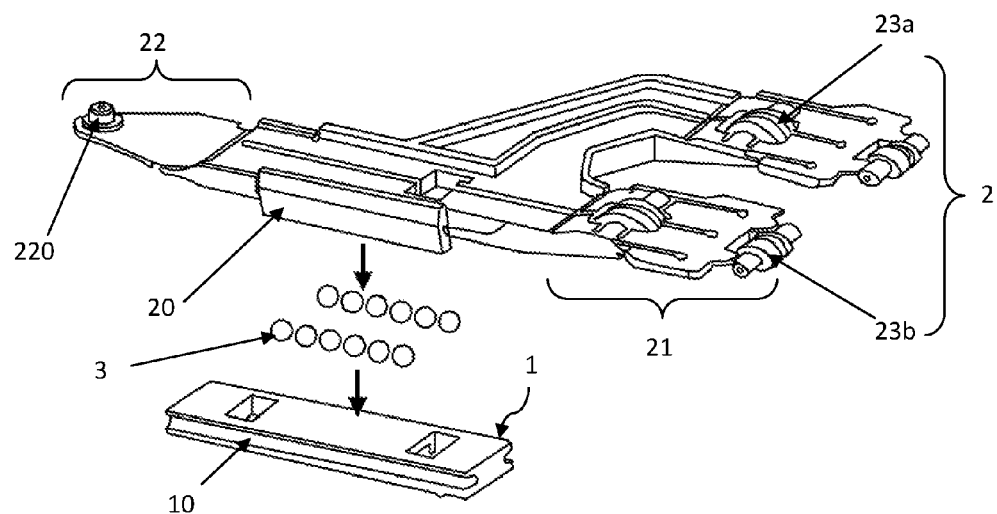
FIG. 2 is an exploded view of a latch guide assembly in accordance with at least one embodiment of the present invention.
Figure 4A:
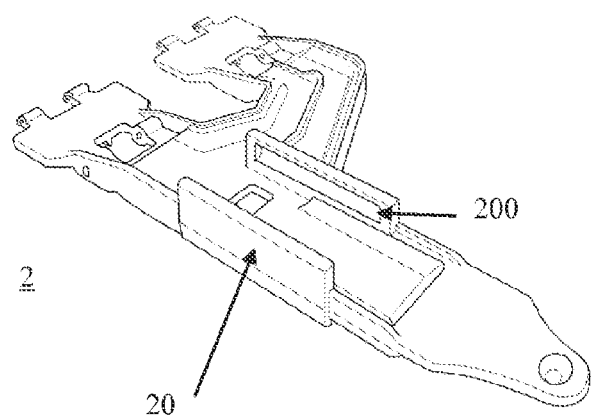
FIG. 4A illustrates a latch module in accordance with at least one embodiment of the present invention.

FIG. 2 is an exploded view of a latch guide assembly in accordance with at least one embodiment of the present invention. The latch guide assembly comprises a guide module 1 having at least one guiding groove 10, a latch module 2 having at least one side plate 20, at least one recess 200 (as shown in FIG. 4A) configured on the at least one side plate 20, and at least one rolling unit 3 configured between the at least one guiding groove 10 and the at least one recess 200. The latch module 2 combines with the guide module 1 via the at least one rolling units 3 and is able to move along with the guide module 1.

Figure 3:
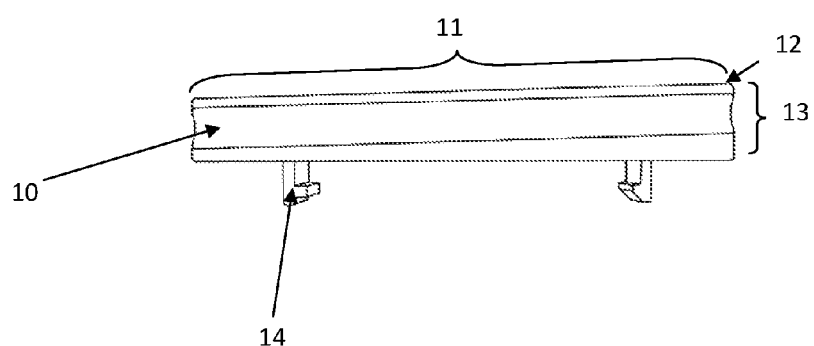
FIG. 3 illustrates a guide module in accordance with at least one embodiment of the present invention.

FIG. 3 illustrates a guide module in accordance with at least one embodiment of the present invention. The opposite ends of the guide module 1 in FIG. 3 have different thicknesses, in which the thicker end is disposed toward the edge of a wafer carrier and the at least one guiding groove 10 (i.e., a linear groove) is obliquely configured on the lateral plane 13 of the guide module 1. Accordingly, the guide module 1 is contemplated to be an inclined plane 11 disposed on the bottom of the wafer carrier, and the top plane 12 of the inclined plane 11 is laid outward on the wafer carrier. In the present embodiments, each of both lateral planes 13 of the guide module 1 comprises a guiding groove 10 disposed in parallel with the inclined plane 11. The guiding groove 10 is capable of accommodating the rolling unit 3 and forms a track to guide the movement of the latch module 2. In some embodiments, the guide module 1 further comprises at least one engaging member 14 to attach the guide module 1 to the bottom of a wafer carrier. The guide module 1 may be connected to the bottom of a wafer carrier by different methods in different embodiments, therefore the engaging member 14 may, but not limited to, utilize methods such as screwing, clamping, affixing, bolting, or other means to fix the guide module 1 to the bottom of the wafer carrier.

According to the embodiments illustrated in FIG. 2, the latch module 2 may comprise at least one side plate 20, at least one front plate 21, and a rear plate 22. The at least one front plate 21 is further connected to a roller member 23a or a roller member 23b, both are configured for the latch module 2 to be moved smoothly. More particularly, each latch module 2 in FIG. 2 comprises two side plates 20, two front plates 21, and one rear plate 22. The rear plate 22 further comprises a connector member 220 configured to connect with a lock module disposed on the bottom of a wafer carrier. The latch module 2 may use different methods to connect the lock module in different embodiments, therefore a connector member 220 on the rear plate 22 may, but not limited to, be a puncture, screw hole, bolt, or other means to connect the rear plate 22 to the lock module. The two front plates 21 are respectively connected with the roller member 23a and the roller member 23b by, but not limited to, screws or bolts. In the present embodiments, the size of the roller member 23a is slightly larger than that of the roller member 23b, and both of the roller members 23a, 23b are configured to move the latch module 2 smoothly. In some other embodiments, the at least one side plate 20, at least one front plate 21, a rear plate 22, and the connector member 220 are formed integrally to reduce the number of sub-components used in a latch module 2 and therefore lessen the dust pollution generated from abrasion between the sub-components.

Figure 4B:
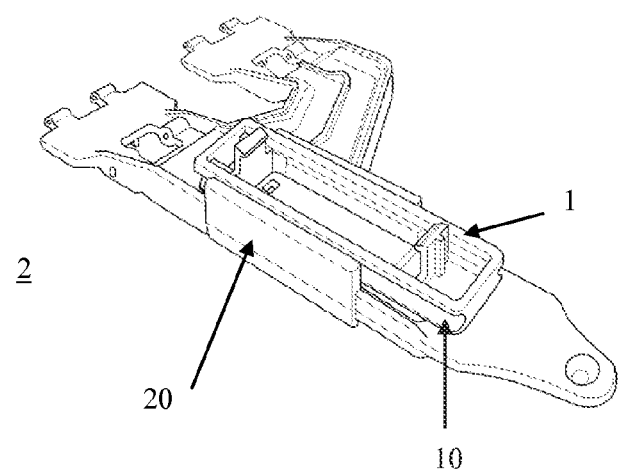
FIG. 4B is a view of a latch module connected to a guide module in accordance with at least one embodiment of the present invention.
Figure 5:
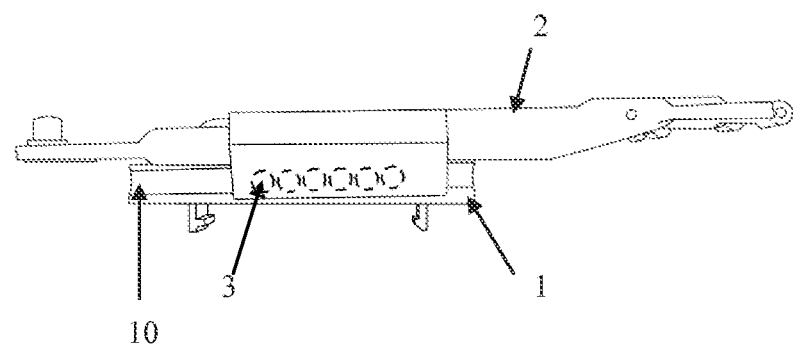
FIG. 5 is a side view of a latch guide assembly in accordance with at least one embodiment of the present invention.

FIGS. 4A-4B and FIG. 5 illustrate a latch module, a latch module connected to a guide module, and a side view of a latch guide assembly respectively. As illustrated in FIGS. 4A-4B, side plates 20 are disposed at the lateral planes of a latch module 2, and the surface of each side plate 20 facing the latch module 2 contains a guiding groove 10 configured to accommodate rolling units 3. Furthermore, a guide module 1 is located between the two side plates 20 of the latch module 2. In FIG. 5, the rolling unit 3 is accommodated between the side plate 20 of a latch module 2 and the guiding groove 10 of a guide module 1. The recess 200 on the side plate 20 limits the location and relative movement of the rolling unit 3 on the guiding groove 10. In the present embodiments, the length of the recess 200 is less than that of the guiding groove 10, and the moving distance of the latch module 2 under the force applied by a lock module does not exceed the length of the guiding groove 10.

Figure 6:
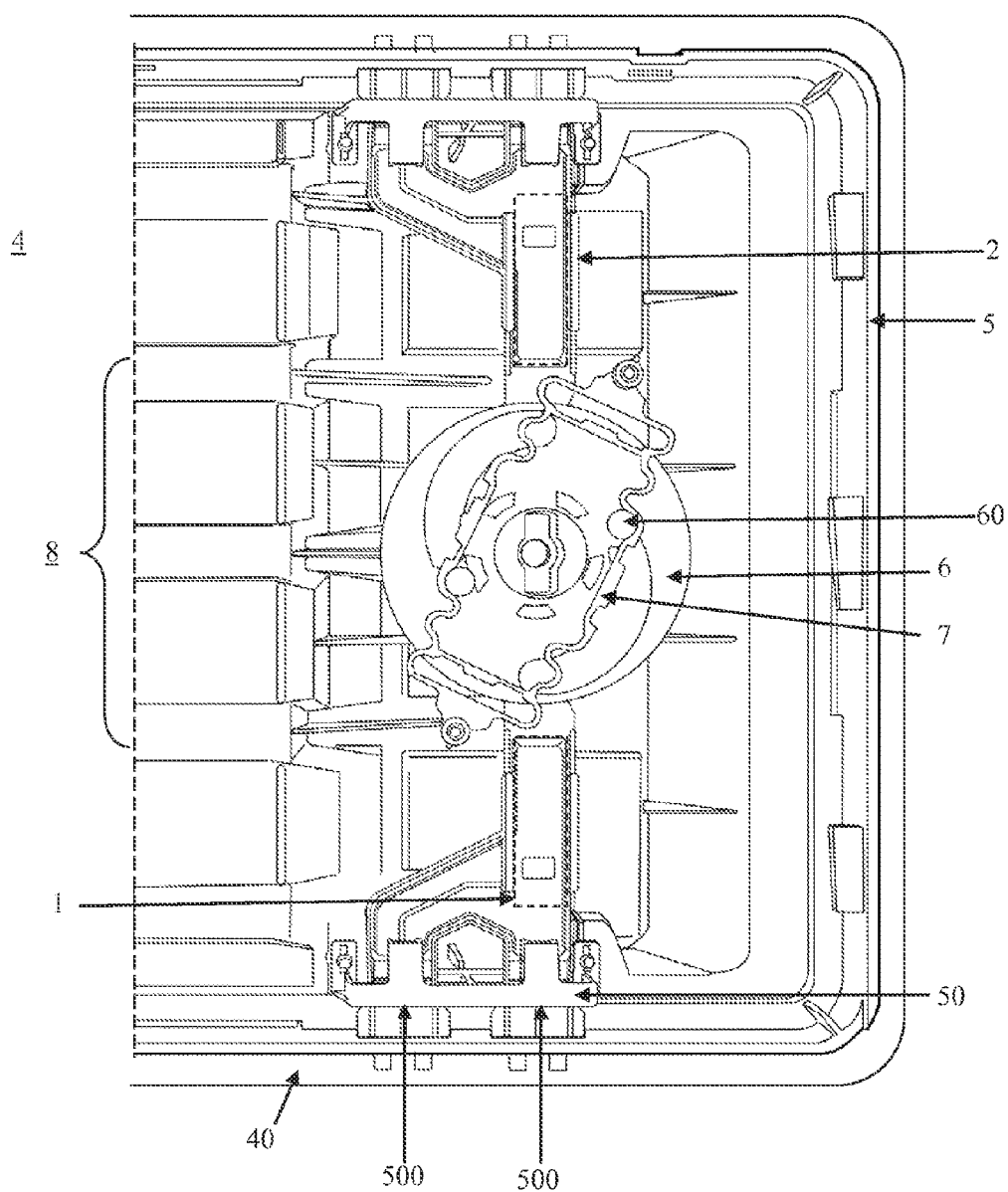
FIG. 6 illustrates the bottom of a wafer carrier in accordance with at least one embodiment of the present invention.

FIG. 6 illustrates the bottom of a wafer carrier in accordance with at least one embodiment of the present invention. The embodiment provides a wafer carrier comprising the latch guide assembly disclosed in other embodiments of the present invention. The latch guide assembly in FIG. 6 is configured on the bottom 5 of the wafer carrier. For the purpose of emphasizing the configuration of a guide module 1, the seal plate on the bottom 5 of a wafer carrier is omitted and only part of the bottom 5 is illustrated in FIG. 6.

As illustrated in FIG. 6, both the guide module 1 and the latch module 2 of a latch guide assembly are disposed on the bottom 5 of a wafer carrier. The rolling unit (not shown) is further disposed between the side plates of a latch module 2 and a guide module 1. A pair of latch slots 50 disposed at the edges of the bottom 5 is used as blocks to constrain the relative movement of the latch module 2 on the bottom 5. The latch slots 50 are also used to impede the latch module 2 from the progression of being moving imprecisely, since the latch slots 50 may protect the latch module 2 from improper operations of workers (e.g., turning the lock module unduly) and aging and deformations of mobile components after a long-term operation. In the present embodiments, the wafer carrier comprises a least two latch slots 50, and each latch slot 50 further comprises at least two mouths 500 configured to accommodate a latch module 2. The mouths 500 are disposed in accordance with the positions of the front plates 21 of the latch modules 2. Correspondingly, the door frame 40 of the wafer carrier is disposed at the circumferential region of the body near the bottom 5, and the door frame 40 comprises holes (not shown) configured for the front plates 21 to further extend through. The latch guide assembly in the present embodiments is used to lock/unlock the wafer carrier.

In some embodiments, the bottom 5 further contains a lock module 8 comprising a pivot member 6 and an elastic positioning member 7. The guide module 1 connects to the pivot member 6 via the connector member 220 on the rear plate 22 of the latch module 2 and therefore is connected to the bottom 5 of the wafer carrier. Furthermore, the elastic positioning member 7 is configured on the pivot member 6 and two auxiliary units 60 on the pivot member are closely surrounded by the elastic positioning member 7. The elastic positioning member 7 further comprises four arcuate notches 71 configured to accommodate the auxiliary units 60. The arcuate notch 71 and the auxiliary unit 60 together provide a mechanism to rotate the lock module 8 precisely.

Figures 7A, 7B:
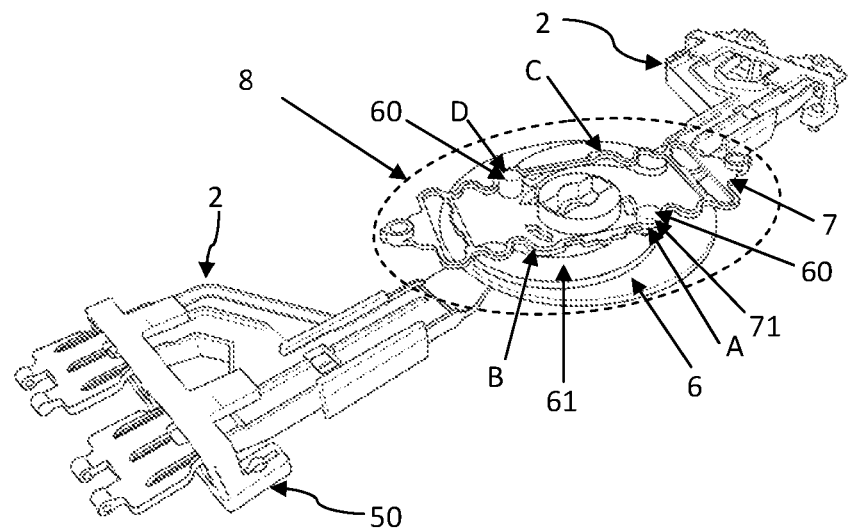
FIG. 7A is a top perspective view of a lock module in accordance with at least one embodiment of the present invention.
FIG. 7B is a bottom perspective view of a lock module in accordance with at least one embodiment of the present invention.

FIGS. 7A-7B are perspective views for detail description of the operation of a lock module in accordance with at least one embodiment of the present invention. As the top perspective view illustrated in FIG. 7A, the lock module 8 connects to latch guide assembly via the latch module 2. In the embodiments, the lock module 8 comprises a pivot member 6 and an elastic positioning member 7. The pivot member 6 further comprises two auxiliary units 60 and two curved tracks 61, and the elastic positioning member 7 further comprises four arcuate notches 71. The two curved tracks 61 are disposed oppositely at the places adjacent to the pivot member 6 and each of the two curved tracks 61 contacts with an auxiliary unit 60. The auxiliary units 60 are closely surrounded by the elastic positioning member 7 and the arcuate notches 71 are configured to accommodate the auxiliary units 60. The auxiliary units 60 move back and forth as the pivot member 6 is turned, and the arcuate notches 71 on the elastic positioning member 7 subsequently contract/stretch with the movement of the auxiliary units 60. An auxiliary unit 60 may move between position A and position B or between position C and position D on the elastic positioning member 7 and therefore helps the pivot member 6 to turn precisely. Furthermore, the connector member 220 on the latch module 2 is inserted into the curved track 61 and moves along the curved track 61 as the pivot member 6 is turned. For example, a pivot member 6 of the lock module 8 rotates clockwise would drive the connector member 220 to move along the curved track 61 and subsequently moves the latch module 2.

FIG. 7B is a bottom perspective view of a lock module in accordance with at least one embodiment of the present invention. In this figure, the guiding groove 10 on the guide module 1 provides a track to guide the movement and moving direction of the latch module 2. As illustrated in FIG. 3, the opposite ends of guide module 1 have different thicknesses and resulted in an inclined plane 11 formed on the guide module 1. A guiding groove 10 is further disposed in parallel with the inclined plane 11. Thus, as the rolling unit 3 slides along the guiding groove 10 and moves toward the top plane 12, the latch module 2 glides upward to the top plane 12 of the guide module 1 with the rolling unit 3.

According to the embodiments of FIG. 6, the guide module 1 is disposed on the bottom 5 of a wafer carrier and the latch module 2 is able to move with the rolling unit 3 in the guiding groove 10. To lock the wafer carrier, the latch module 2 would be moved in a direction from the lock module 8 toward the door frame 40 on the body 4 until the front plate 21 of the latch module 2 is protruded from the door frame 4. Contrarily, rotate the lock module 8 anticlockwise would pull the latch module 2 back via the connection between the lock module 8 and the latch module 2 and unlock the wafer carrier. More precisely, to unlock the wafer carrier, the latch module 2 guided by the guiding groove 10 on the guide module 1 would be retracted from the door frame 40 and moved toward the lock module 8 with the assistance of the rolling unit 3, and the front plate 21 would retreat from the mouth 50 and slide back to the bottom 5 with latch module 2.

In some embodiments, a pair of lock modules is configured on the bottom of a wafer carrier, and each lock module further connects to a pair of the latch guide assemblies disclosed in the previous embodiments. The four latch modules, four guide modules, and multiple rolling units disposed therebetween are used to reduce the resistance as turning the lock module of the wafer carrier. The latch guide assemblies provide a mechanism to operate the lock module smoothly. In some other embodiments, the numbers of the latch guide assembly and the lock module may be changed based on other purposes. The latch module, the guide module, and the rolling unit in some embodiments are made of anti-rub materials such as polyetheretherketone (PEEK) to improve their strengths. These components usually contact and move with one another and the use of anti-rub materials would further suppress the dust pollution during wafer production.

The latch guide assembly may be applied on any wafer carrier compatible with the latch guide assembly. The latch guide assembly comprises holes configured on the surface of the body for the front plate of the latch module to penetrate through. The lock module cooperating with the latch guide assembly shall be able to connect to the latch module of the latch guide assembly, but the operating mechanism of the lock module is not limited to the mechanisms based on rotation or parallel movement. As illustrated in FIG. 6, the lock module and the latch guide assembly together are disposed on the bottom of a wafer carrier. With the latch module, the guide module, and the rolling unit configured therebetween, the latch guide assembly may lock/unlock the wafer carrier precisely, reduce abrasion between components in the latch guide assembly, and suppress dust pollution in wafer production.

The figures and descriptions supra set forth only illustrated the preferred embodiments of the instant disclosure; however, the characteristics of the instant disclosure are by no means restricted thereto. All changes, alternations, combinations or modifications easily considered by the people skilled in the art are deemed to be encompassed within the scope of the instant disclosure delineated by the following claims.

What is claimed is:

1. A latch guide assembly configured on a bottom of a wafer carrier, comprising:
   a guide module, connected to the bottom and comprising at least one guiding groove;
   a latch module, comprising at least one side plate, at least one front plate, and a rear plate, wherein the at least one side plate further comprises at least one recess; and
   at least one rolling unit, wherein the at least one rolling unit is configured between the at least one guiding groove and the at least one recess;
   a latch slot, comprising at least two mouths configured to accommodate the at least one front plate;
   a lock module, connected to the bottom of the wafer carrier and the rear plate respectively and comprising a pivot member and an elastic positioning member;
   wherein the pivot member contains two auxiliary units and the elastic positioning member contains four arcuate notches;
   wherein the two auxiliary units are surrounded by the elastic positioning member and the four arcuate notches are configured to accommodate the two auxiliary units;
   wherein the latch module combines with the guide module via the at least one rolling unit and the latch module is able to protrude or retract along the guide module.

2. The latch guide assembly as claimed in claim 1, wherein two ends of the guide module have different thicknesses, and wherein the at least one guiding groove is a linear groove and is configured on the guide module obliquely.

3. The latch guide assembly as claimed in claim 1, wherein the guide module further comprises at least one engaging member.

4. The latch guide assembly as claimed in claim 1, wherein the at least one rolling unit is a ball, a roller or a bearing.

5. The latch guide assembly as claimed in claim 1, wherein the at least one front plate further connects to a roller member.

6. The latch guide assembly as claimed in claim 1, wherein the rear plate further connects to a connector member.

7. The latch guide assembly as claimed in claim 6, wherein the at least one side plate, the at least one front plate, the rear plate, and the connector member are formed integrally.

8. The latch guide assembly as claimed in claim 1, wherein the guide module, the latch module, or the at least one rolling unit is made of polyetheretherketone (PEEK).

* * * * *